(12) United States Patent
Yeung

(10) Patent No.: US 11,704,196 B2
(45) Date of Patent: *Jul. 18, 2023

(54) REDUCED PARITY DATA MANAGEMENT

(71) Applicant: Micron Technology, Inc., Boise, ID (US)

(72) Inventor: Chun Sum Yeung, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/712,978

(22) Filed: Apr. 4, 2022

(65) Prior Publication Data

US 2022/0229728 A1 Jul. 21, 2022

Related U.S. Application Data

(63) Continuation of application No. 17/004,136, filed on Aug. 27, 2020, now Pat. No. 11,321,176.

(51) Int. Cl.
*G11C 29/00* (2006.01)
*G06F 11/10* (2006.01)
(Continued)

(52) U.S. Cl.
CPC ...... *G06F 11/1076* (2013.01); *G06F 11/0772* (2013.01); *G06F 11/1068* (2013.01); *G06F 11/3037* (2013.01); *G11C 11/4085* (2013.01)

(58) Field of Classification Search
CPC .............. G06F 11/1076; G06F 11/1068; G06F 11/3037; G06F 11/0772
See application file for complete search history.

(56) References Cited

U.S. PATENT DOCUMENTS

2008/0297197 A1* 12/2008 Winograd ............ H03K 19/215
326/54
2012/0084622 A1* 4/2012 D'Abreu ............. G06F 11/1048
714/755
(Continued)

FOREIGN PATENT DOCUMENTS

WO 2017074570 5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.
(Continued)

*Primary Examiner* — Samir W Rizk
(74) *Attorney, Agent, or Firm* — Brooks, Cameron & Huebsch, PLLC

(57) ABSTRACT

A method includes receiving, by a memory sub-system, host data to be written to a plurality of blocks of a memory device associated with a memory sub-system, where each of the plurality of blocks are coupled to one of a plurality of word lines of the memory device. The method can further include generating parity data for each word line of the block; dividing the parity data into one of either a first word line parity set or a second word line parity set; generating a reduced parity data set with exclusive or parity values for the first word line parity set and for the second word line parity set; and writing the reduced parity data set in the memory sub-system.

17 Claims, 6 Drawing Sheets

(51) Int. Cl.
*G11C 11/408* (2006.01)
*G06F 11/30* (2006.01)
*G06F 11/07* (2006.01)

(56) References Cited

U.S. PATENT DOCUMENTS

2014/0231954 A1    8/2014  Lue
2016/0179386 A1    6/2016  Zhang
2017/0315867 A1*  11/2017  Yang ................... G06F 11/1072

OTHER PUBLICATIONS

U.S. Application, entitled, "Managing Storage of Multiple Plane Data in a Memory Subsystem", Filed on Apr. 21, 2020, 47 pages.

* cited by examiner

REDUCED PARITY DATA MANAGEMENT

PRIORITY INFORMATION

This application is a Continuation of U.S. application Ser. No. 17/004,136, filed Aug. 27, 2020, the contents of which are included herein by reference.

TECHNICAL FIELD

Embodiments of the disclosure relate generally to memory sub-systems, and more specifically, relate to reduced parity data management for a memory sub-system

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
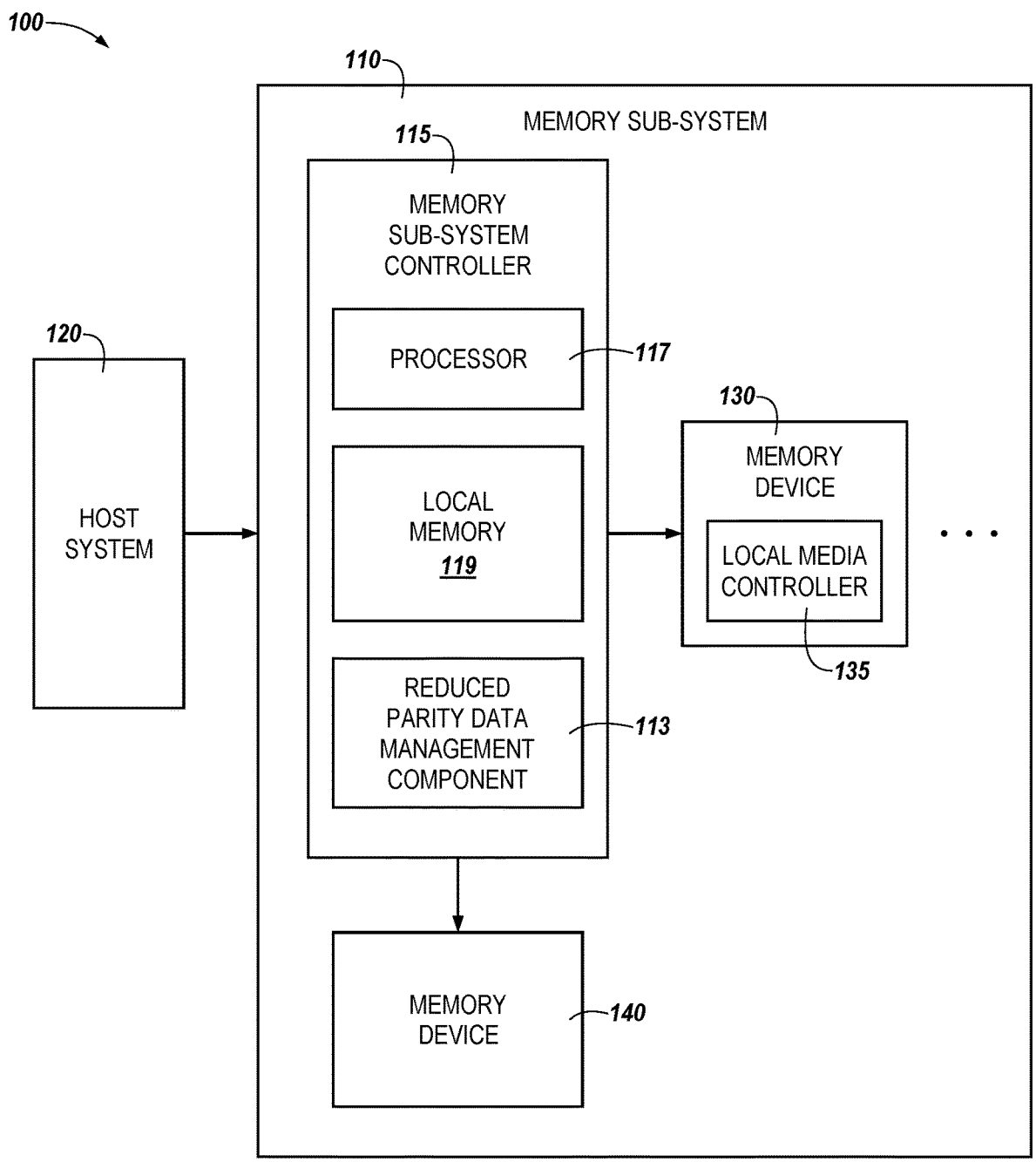
FIG. 1 illustrates an example computing system that includes a memory sub-system in accordance with some embodiments of the present disclosure.

Aspects of the present disclosure are directed to a reduced parity data management component, in particular to a memory sub-system that includes the reduced parity data management component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

A memory sub-system can employ techniques to perform data recovery in the event of a memory defect associated with the programming of user data (e.g., data written by a host system) to a memory device of the memory sub-system. Conventionally, memory defects can be managed by a controller of the memory sub-system by generating parity data (e.g., exclusive-or (XOR) parity data) based on the written host data. The generated parity data (e.g., the XOR parity data) can be written by a controller to a cache memory (e.g., a volatile memory device such as a random access memory (RAM), dynamic random access memory (DRAM), or synchronous dynamic random access memory (SDRAM)) of the controller.

In many electronic devices (e.g., mobile devices) including electronic devices having an array of memory cells storing multiple bits per cell (e.g., quad-level cells (QLCs)), both multiple page (e.g., multi-page) parity protection and multiple plane (e.g., multi-plane) parity protection (e.g., protection for a failure of a memory device) is employed. In such systems, a large amount of cache memory storage space is required to store both multi-page parity data and multi-plane parity data. For example, for multi-page parity protection, 16 KB of parity data can be generated for each page line of the memory sub-system. In addition, a memory sub-system can have a multi-plane memory die (e.g., N planes) including multiple blocks of memory cells arranged in multiple planes (e.g., a multi-plane memory device) for which multi-plane parity protection can be employed. Each block can be divided into multiple sub-blocks that can each include multiple pages per block.

In general, major failures in a memory sub-system can invoke multiple word lines of the memory device and/or multiple planes of the memory device. Memory sub-systems having multiple planes (e.g., N planes per memory die) can require generation and storage of multi-plane parity data to enable protection against a multi-plane failure (e.g., a failure of some or all planes of the memory device). Similarly, memory sub-systems having multiple pages can require generation and storage of multi-page parity data to enable protection against a failure invoking multiple word lines of the memory device (e.g., a failure of some or all word lines of the memory device). However, protecting against both multi-word line failures and multi-plane failures can be difficult both in terms of an amount of memory space required to protect against both types of failures and in performance limitations associated with a memory sub-system.

Currently, redundant array of independent NAND (RAIN) parity protection for a memory sub-system in an SSD can utilize a significant portion of the end-user capacity of the SSD. In other words, the amount of NAND available to the user can be affected by the addition of the RAIN parity protection. The term "RAIN," as used herein, is an umbrella term for computer information (e.g., data) storage schemes that divide and/or replicate (e.g., mirror) information among multiple pages of a memory sub-system, for instance, in order to help protect the data stored in the memory sub-system. A RAIN array may appear to a user and the operating system of a computing device as a single memory device (e.g., disk). RAIN can include striping (e.g., splitting) information so that different portions of the information are stored on different pages of the memory sub-system. The portions of the memory sub-system that store the split data can be collectively referred to as a stripe. As used herein, RAIN can also include mirroring, which can include storing duplicate copies of data on more than one page of more than one memory sub-system.

A RAIN stripe can include (e.g., be a combination of) user data and parity data. The parity data of the RAIN stripe, which can be referred to herein as the parity portion of the RAIN stripe, can include error protection data that can be used to protect user data stored in the memory sub-system against defects and/or errors that may occur during operation of the memory sub-system. For example, the RAIN stripe can protect user data stored in memory sub-system against defects and/or errors that may occur during operation of the memory sub-system and can therefore provide protection against a failure of the memory sub-system.

The RAIN parity protection design, however, generally utilizes storage in the cache memory of the controller. As a result, RAIN parity protection designs having one parity element (e.g., a single RAIN stripe) for each group of storage elements, which reduces the available storage by a comparable amount. Furthermore, some RAIN parity protection designs utilize both permanent parity and temporary parity in the parity protection scheme. Permanent parity protection is where the RAIN parity is written into NAND and is available for data recovery until the block is erased. Temporary parity protection is where the RAIN parity in either RAIN SRAM or written into NAND is temporarily available until the block is closed. For this latter case, RAIN protects against unrecoverable errors by proactively checking data integrity through a read scan operation before such temporary parity is released. In the read scan operation, the SSD is continuously tested for failures that are then stored for correction during an idle time of the memory device. This process, however, is time consuming and interferes with the performance path of the memory device. There is a need, therefore, to minimize the performance impact of the read scan operation.

Aspects of the present disclosure address the above and other deficiencies by issuing read scan operations during an idle time of the memory device, thereby moving the read scan operation out of the performance path of the memory device. In this way, the RAIN recovery described herein provides protection for unrecoverable errors of multi-page and/or multi-plane failures without incurring extemporaneous program status failures while mitigating negative impacts to memory sub-system performance inherent in some approaches. Additional challenges with this approach, however, include holding the temporary parities until there is sufficient idle time to perform media management operations, such as RAIN recovery operations, and reducing the size of the parity data that is stored in the memory sub-system to best utilize the available memory resources.

For example, RAIN protection temporarily stores parity for a super block in single-level cells (SLC) until the super block closes, where such storage can require upwards of 25 Megabytes of SLC. Issuing read scans only at an idle time for a memory device having many hundreds of storage blocks would, therefore, require many gigabytes of SLC (e.g., 25 MB/block*740 blocks per memory device would require about 18 GB of SLC), which is not acceptable. To address this problem, the present disclosure divides the parity data for each word line of a block of the memory sub-system in the memory device into separate parity sets. The memory sub-system generates a reduced parity data set from the separate parity sets by executing an exclusive or (XOR) operation, where the reduced parity data set is written in the memory sub-system after a successful program operation occurs on one or more pages of the memory device. Such an operation reduces the RAIN parity protection from what had been a full physical block down to just a few word lines, which is sufficient for providing error correction in situations where there is no program system failure (PSF) thereby covering errors that are uncorrectable with error correction codes (e.g., UECCs) without PSF. The result is a vast reduction in temporary SLC space required to store the parity data (e.g., 384 KB of SLC per super block, down from 25 MB per super block noted above), which can be stored until a read scan is issued.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a reduced parity data management component 113. Although not shown in FIG. 1 so as to not obfuscate the drawings, the reduced parity data management component 113 can include various circuitry to facilitate organization and selective writing of data (e.g., parity data) to particular pages of memory of a memory device 130, 140. For example, the reduced parity data management component 113 generates parity data (e.g., the data 338-1 to 338-7 described in connection with FIG. 3, herein) for each word line of a block of the memory device 130, 140 and divides the parity data into one of either a first word line parity set or a second word line parity set. The reduced parity data management component 113 further generates a reduced parity data set with exclusive or (XOR) parity values for the first word line parity set and for the second word line parity set and writes the reduced parity data set in the memory sub-system (e.g., in the local memory 119). In some embodiments, the reduced parity management component 113 can include special purpose circuitry in the form of an ASIC, FPGA, state machine, and/or other logic circuitry that can allow the reduced parity data management component 113 to orchestrate and/or perform operations to selectively perform operations to perform word line parity set management operations for the memory device 130 and/or the memory device 140 as described herein.

In some embodiments, the memory sub-system controller 115 includes at least a portion of the reduced parity data management component 113. For example, the memory sub-system controller 115 can include a processor 117 (processing device) configured to execute instructions stored in local memory 119 for performing the operations described herein. In some embodiments, the reduced parity data management component 113 is part of the host system 110, an application, or an operating system.

In a non-limiting example, an apparatus (e.g., the computing system 100) can include a reduced parity data management component 113. The reduced parity data management component 113 can be resident on the memory sub-system 110. As used herein, the term "resident on" refers to something that is physically located on a particular component. For example, the reduced parity data management component 113 being "resident on" the memory sub-system 110 refers to a condition in which the hardware circuitry that comprises the reduced parity data management component 113 is physically located on the memory sub-system 110. The term "resident on" may be used interchangeably with other terms such as "deployed on" or "located on," herein.

Figure 2:
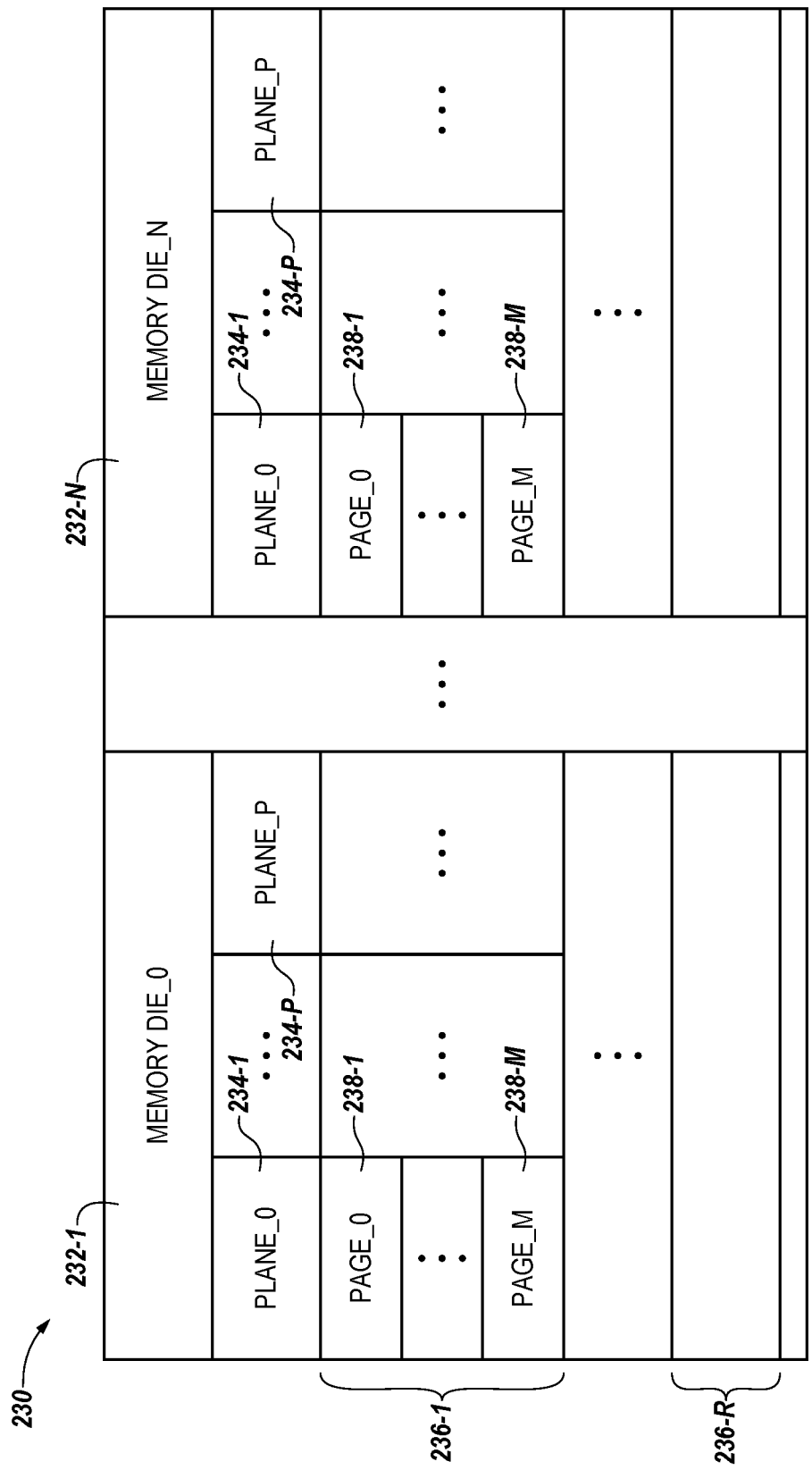
FIG. 2 illustrates an example memory device in accordance with some embodiments of the present disclosure.

FIG. 2 illustrates an example memory device 230 in accordance with some embodiments of the present disclosure. The memory device 230 can be analogous to the memory device 130 illustrated in FIG. 1, herein. Although not shown so as not obfuscate the drawings, the memory device 230 can be a non-volatile memory device 230 that includes an array of non-volatile memory cells. In some embodiments, the memory device 230 can be a NAND flash memory device (e.g., a 3-D NAND flash memory device) and/or can be deployed in a mobile computing device such as a mobile phone, laptop, IoT device, or the like.

As shown in FIG. 2, the memory device 230 can include multiple memory dice 232-1 to 232-N (e.g., the MEMORY DIE_0 to the MEMORY DIE_N), which can each include multiple planes 234-1 to 234-P (e.g., the PLANE_0 to the PLANE_P). A number of pages, which can be referred to as blocks (or sub-blocks) 238-1 to 238-M (e.g., the BLOCK_0 to the BLOCK_M), can be included in each of the planes 234-1 to 234-P. That is, as shown in FIG. 2, a number of pages or physical blocks (or sub-blocks) 238-1 to 238-P can be included in a plane 234-1 to 234-P, and a number of planes 234-1 to 234-P can be included on a memory die 232-1 to 232-N.

As shown in FIG. 2, the blocks 238-1 to 238-M can be included in one or more physical rows 236-1 to 236-R. The rows 236-1 to 236-R can be coupled to word lines (e.g., access lines) and can, as is appropriate given the context, be referred to as word lines 236-1 to 236-R, herein. Further, although not shown in FIG. 2, the memory cells can be coupled to sense lines (e.g., data lines and/or digit lines). As one of ordinary skill in the art will appreciate, each row 236-1 to 236-R can include a number of blocks of memory cells (e.g., physical pages). A block of memory cells refers to a unit of programming and/or sensing (e.g., a number of memory cells that are programmed and/or sensed together as a functional group). In some embodiments, each row 236-1 to 236-R comprises one block of memory cells. However, embodiments of the present disclosure are not so limited. For instance, in some embodiments, each row 236-1 to 236-R can include multiple blocks 238-1 to 238-M of memory cells (e.g., one or more even blocks of memory cells coupled to even-numbered word lines and/or bit lines, and one or more odd blocks of memory cells coupled to odd numbered word lines and/or bit lines). For example, the row/word line 236-1 can be referred to as an "odd" word line and a physically adjacent row/word line (e.g., the word line 336-2 illustrated in FIG. 3) can be referred to as an "even" word line. Similarly, other rows/word lines that are not illustrated can be referred to in the same manner such that the third, fifth, seventh, etc. word lines are considered to be "odd" word lines and the fourth, sixth, eight, etc. word lines are considered to be "even" word lines. Additionally, for embodiments including multilevel cells, a block 238-1 to 238-M of memory cells can store multiple logical blocks of data (e.g., an upper block of data and a lower block of data, with each cell in a block storing one or more bits towards an upper block of data and one or more bits towards a lower block of data).

Although not explicitly shown in FIG. 2, a row 236-1 to 236-R of memory cells can comprise a number of physical sectors (e.g., subsets of memory cells). Each physical sector of cells can store a number of logical sectors of data. Additionally, each logical sector of data can correspond to a portion of a particular block of data. As an example, one logical sector of data stored in a particular physical sector can correspond to a logical sector corresponding to one block (e.g., block 238-1) of data, and the other logical sector of data stored in the particular physical sector can correspond to other blocks (e.g., block 238-M) of data. Each physical sector can store system data, user data, and/or overhead data, such as error correction code (ECC) data, LBA data, and/or metadata.

Figure 3:
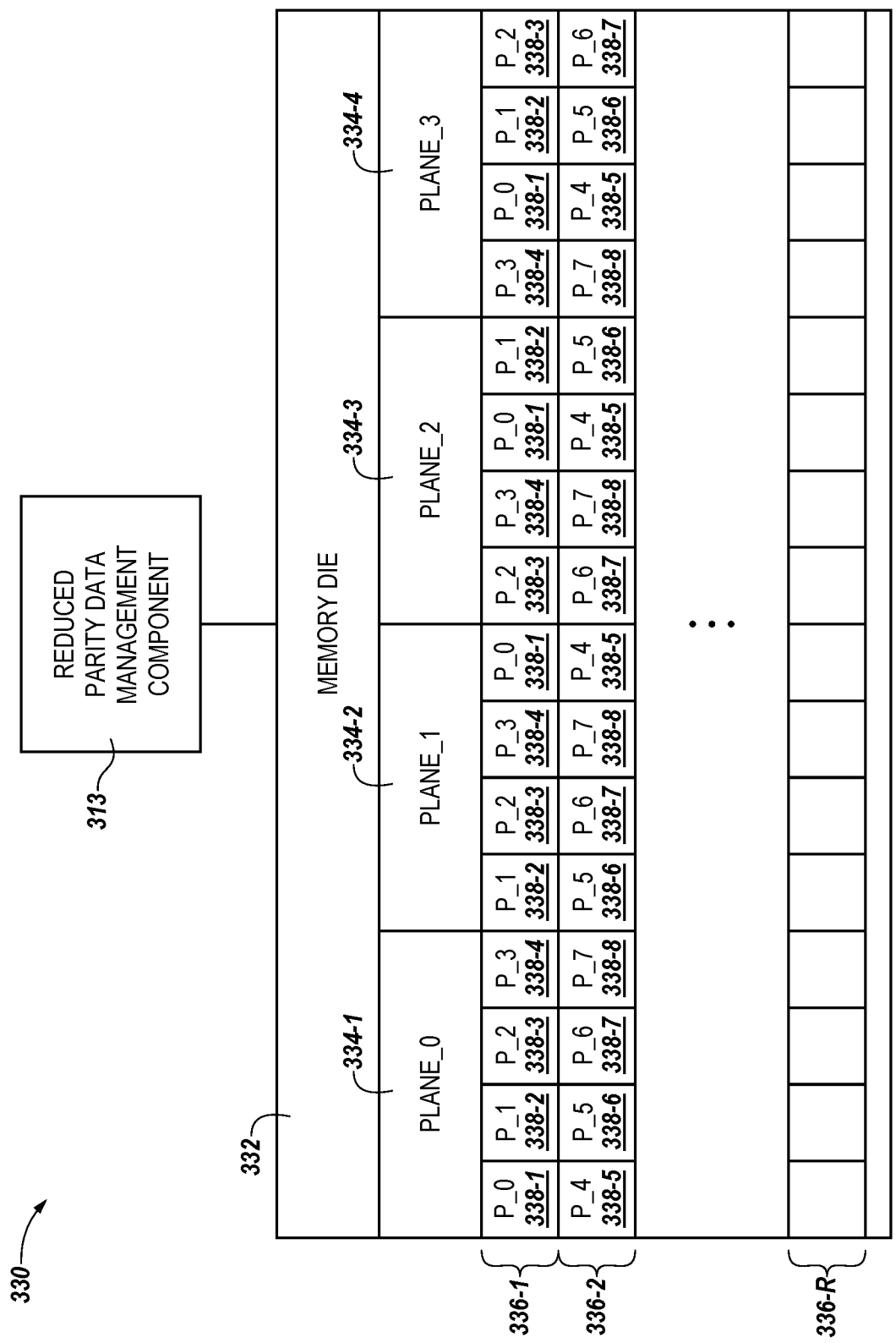
FIG. 3 illustrates an example memory device and a reduced parity data management component in accordance with some embodiments of the present disclosure.

FIG. 3 illustrates an example memory device 330 and reduced parity data management component 313 in accordance with some embodiments of the present disclosure. The reduced parity data management component 313 can be analogous to the reduced parity data management component 113 illustrated in FIG. 1 and the memory device 330 can be analogous to the memory device 130 illustrated in FIG. 1 and/or the memory device 230 illustrated in FIG. 2. In some embodiments, the memory device 330 and/or the reduced parity data management component 313 can be deployed in a mobile computing device, such as a smart-phone, laptop computer, IoT device, or the like.

As shown in FIG. 3, the memory device 330 includes a memory die 332, which can be analogous to one of the memory dice 232-1 to 232-N illustrated in FIG. 2. The memory die 332 can include multiple memory planes (PLANE_0 334-1, PLANE_1 334-2, PLANE_3 334-3, PLANE_4 334-4, etc.), which can be analogous to the memory planes 234-1 to 234-N illustrated in FIG. 2. Each of the planes 334-1 to 334-4 can include one or more blocks (or sub-blocks) (e.g., the blocks 238-1 to 238-M illustrated in FIG. 2, herein) that can include a block of data (B_0 338-1, B_1 338-2, B_2 338-3, B_3 338-4, B_4 338-5, B_5 338-6, B_6 338-7, B_7 338-8, etc.). The blocks of data 338-1 to 338-8 can include parity data (e.g., RAIN parity data) that can be used in a data recovery operation such as a RAIN recovery operation.

Blocks of the memory device (e.g., the blocks 238-1 to 238-M illustrated in FIG. 2, herein) can include data and be referred to as blocks of data 338-1 to 338-8. The blocks of data 338-1 to 338-8 can be included in one or more physical rows 336-1 to 336-R, which can be analogous to the physical rows 236-1 to 236-R illustrated in FIG. 2, herein. As described above, the rows 336-1 to 336-R can be coupled to word lines (e.g., access lines) and can, as is appropriate given the context, be referred to as word lines 336-1 to 336-R, herein.

In a non-limiting example, the reduced parity data management component 313 can receive host data to be written to the memory device 330, which can be deployed within a memory sub-system such as the memory sub-system 110 illustrated in FIG. 1. For example, the reduced parity data management component 313 of the memory sub-system receives host data to be written to one or more blocks, sub-blocks, or pages of the memory device associated with a memory sub-system, where each block is coupled to one of multiple word lines of the memory device as discussed herein. The reduced parity data management component 313 generates parity data for each word line (e.g., 336-1 to 336-R) of the memory device 330 for use in a data recovery operation of the memory device 330 (e.g., for each block of the memory device). The reduced parity data management component 313 can cause the parity data for each word line 336-1 to 336-R of the block to be divided into one of at least two word line parity sets. For example, the reduced parity data management component 313 can divide the parity data into one of either a first word line parity set or a second word line parity set. Dividing the parity data into one of either the first word line parity set, or the second word line parity set can be based on a predetermined indexing protocol. The predetermined indexing protocol can identify and assign a relative position for each word line in a given block. Identifying and assigning the relative position for each word line can include, for example, sequentially numbering and assigning the word lines of the given block with a positive integer (e.g., 1, 2, 3, etc.). Once numbered and assigned, the predetermined indexing protocol divides and groups the parity data from each even numbered word lines (e.g., 2, 4, 6, etc.) into, for example, the first word line parity set and each odd numbered word lines (e.g., 1, 3, 5, etc.) into the second word line parity set. Alternatively, the predetermined indexing protocol after identifying and assigning the relative position for each word line in a given block with a positive integer can divide and group the parity data into three word line parity sets (e.g., a first word line parity set, a second word line parity set and a third word line parity set) using, for example, a function having the assigned word line number and a whole number operator. For example, a word line parity set (e.g., one of sets "1" "2" or "3") could be grouped according to the function:

Word Line Number—(3)(X)

where the Word Line Number is a positive integer and X is a whole number (0, 1, 2). Using this function the first word line parity set one would include parity data from lines 1, 4, 7, 10, etc.; the second word line parity set two would include parity data from lines 2, 5, 8, 11, etc. and the third word line parity set would include parity data from lines 3, 6, 9, 12, etc. Other schemes for grouping the parity data into one of the at least two word line parity sets can include those based on the parity data value of the word line in the given block (e.g., grouping the parity data from word lines having a first common parity data value (e.g., "0") in the first word line parity set and grouping the parity data from word lines having a second common parity data value (e.g., "1") in the second word line parity set). Other schemes are also possible.

Figure 4A:
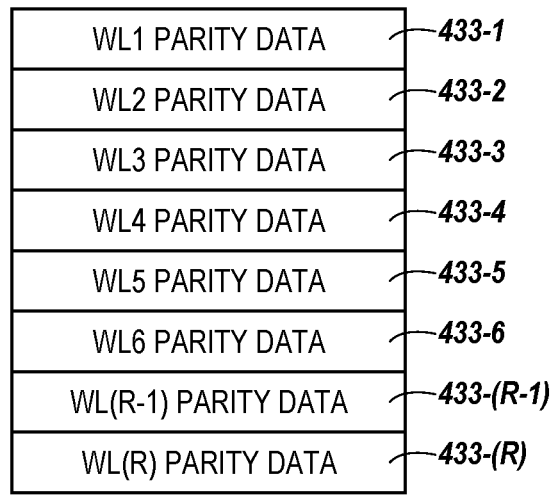
FIG. 4A illustrates an example of a parity data scheme for even and odd numbered word lines of a memory device in accordance with some embodiments of the present disclosure.
Figure 4B:
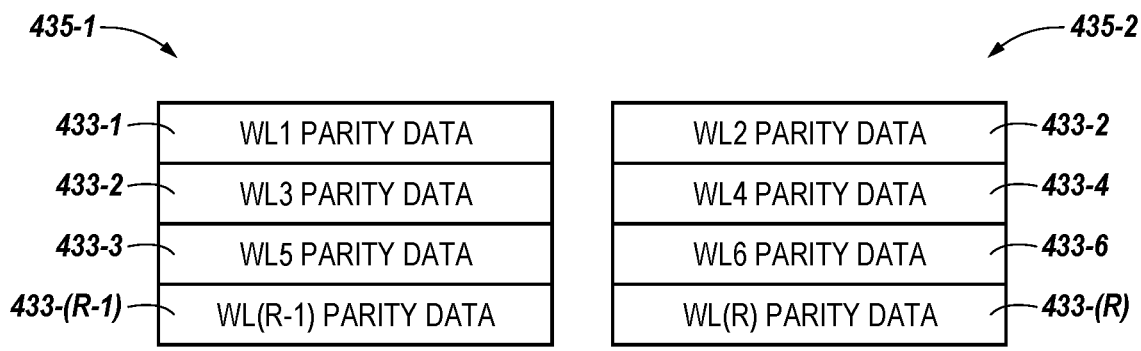
FIG. 4B illustrates an example of grouping word lines containing parity data in accordance with some embodiments of the present disclosure.

The reduced parity data management component 313 generates the reduced parity data set (e.g., the reduced parity data set 437 illustrated in FIG. 4C, herein) from the separate parity sets (e.g., the first word line parity set 435-1 and the second word line parity set 435-2 illustrated in FIG. 4B, herein) by executing an exclusive or (XOR) operation. For the various embodiments, the reduced parity data set can be generated and subsequently written in the memory sub-system in response to a successful program operation invoking a past page. In some embodiments, the reduced parity data set is assigned and written to its own memory stripe (e.g., word line 336-1) that invokes at least one memory die 332 of the memory device 330. Continuing with the above example, the reduced parity data set can be part of a redundant array of independent NAND (RAIN) recovery data set written to the memory device 330. Accordingly, the reduced parity data set can contain data corresponding to a parity portion of RAIN recovery data written to the memory device 330. By writing the parity data (e.g., RAIN parity data) for the blocks of data 338-1 to 338-8 in the manner illustrated in FIG. 3, the RAIN parity protection is drastically reduced from what would have been a full physical block down to just a few word lines, which is sufficient for providing error correction in situations where there is no program system failure (e.g., covering UECC without PSF). The result is a vast reduction in temporary cache resources (e.g., SLC space) required to store the parity data until such time as a read scan may be issued.

In some embodiments, the reduced parity data management component 313 can cause performance of the data recovery operation using the first word line parity set or the second word line parity set or both. The reduced parity data management component 313 can cause performance of the data recovery operation responsive to a determination that that a failure involving host data written to the memory device 330 has occurred. The data recovery operation can be, for example, a RAIN recovery operation to recover host data having uncorrectable errors associated therewith. For example, at least one uncorrectable error associated with a program status fail can be recovered using the reduced parity data set as provided herein. For the various embodiments, the data recovery operation can be performed based on the reduced parity data set during idle time of the memory device. As used herein, an idle time of the memory device includes time during which host operations are not being performed with respect to the memory device and therefore during a time in which an interface coupling the host to the memory sub-system is not encumbered.

In another non-limiting example, a memory sub-system (e.g., the memory sub-system 110 illustrated in FIG. 1, herein) can include multiple memory planes 334-1, 334-2, 334-3, 334-4, etc. Each of the memory planes can include one or more sub-sets of memory blocks (e.g., blocks 238-1 to 238-M illustrated in FIG. 2, herein) that can contain at least a portion of parity data (e.g., RAIN parity data). Each of the word lines 336-1 to 336-R, which contain all of the memory blocks in a given row of the memory device 330, can contain all of the parity data associated with all the blocks in a given row of the memory device 330, as described in more detail in connection with FIGS. 4A-4C, below. A processing device (e.g., the reduced parity data management component 313) can perform operations that include writing the reduced parity data set in a redundant array of independent NAND (RAIN) for each of the memory blocks.

Continuing with this example, in some embodiments, the processing device further perform operations including causing performance of a data recovery operation using the first word line parity set or the second word line parity set or both. For example, the processing device can further perform operations including causing performance of a data recovery operation responsive to a determination that that a failure involving host data written to the sub-sets of memory blocks has occurred. In this way, at least one uncorrectable error associated with a program status fail can be recovered using the reduced parity data set.

FIG. 4A illustrates an example of a parity data scheme for even and odd numbered word lines of a memory device in accordance with some embodiments of the present disclosure. As shown in FIG. 4A, each word line (e.g., the word lines 336-1 to 336-R illustrated in FIG. 3) can have its own parity data associated therewith. For example, the word line 336-1 of FIG. 3 can include WL1 PARITY DATA 433-1, the word line 336-2 of FIG. 3 can include WL2 PARITY DATA 433-2, and so forth ending with the $R^{th}$ word line 336-R of FIG. 3 including WL(R) PARITY DATA 433-(R). As described above, the parity data for each word line can be a sub-set of data contained in the word line. For example, the WL1 PARITY DATA 433-1 can include parity data from each block or page of memory cells contained within the word line.

FIG. 4B illustrates an example of grouping word lines containing parity data in accordance with some embodiments of the present disclosure. As shown in FIG. 4B, the parity data from the odd word lines (e.g., WL1 PARITY DATA 433-1, WL3 PARITY DATA 433-3, WL5 PARITY DATA 433-5, and WL(R-1) PARITY DATA 433-(R-1)) can be grouped into a first word line parity set 435-1 and the parity data from the even word lines (e.g., WL2 PARITY DATA 433-2, WL4 PARITY DATA 433-4, WL6 PARITY DATA 433-6, and WL(R) PARITY DATA 433-(R)) can be grouped into a second word line parity set 435-2.

Figure 4C:
FIG. 4C illustrates an example of a reduced parity grouping of word lines in accordance with some embodiments of the present disclosure.

FIG. 4C illustrates an example of a reduced parity grouping of word lines in accordance with some embodiments of the present disclosure. In FIG. 4C, a reduced parity data set 437 includes the ODD WL PARITY DATA 439-1 and the EVEN WL PARITY DATA 439-2. In some embodiments, the ODD WL PARITY DATA 439-1 is the result of performance of an XOR operation using the parity data from the first word line parity set 435-1 and the EVEN WL PARITY DATA 439-2 is the result of performance of an XOR operation using the parity data from the second word line parity set 435-2. That is, in some embodiments, the ODD WL PARITY DATA 439-1 is the result of performance of an XOR operation using the WL1 PARITY DATA 433-1, the WL3 PARITY DATA 433-3, the WL5 PARITY DATA 433-5, etc. through the WL(R-1) PARITY DATA 433-(R-1) and the EVEN WL PARITY DATA 439-2 is the result of performance of an XOR operation using the WL2 PARITY DATA 433-2, the WL4 PARITY DATA 433-4, the WL6 PARITY DATA 433-6, etc. through the WL(R) PARITY DATA 433-(R).

Figure 5:
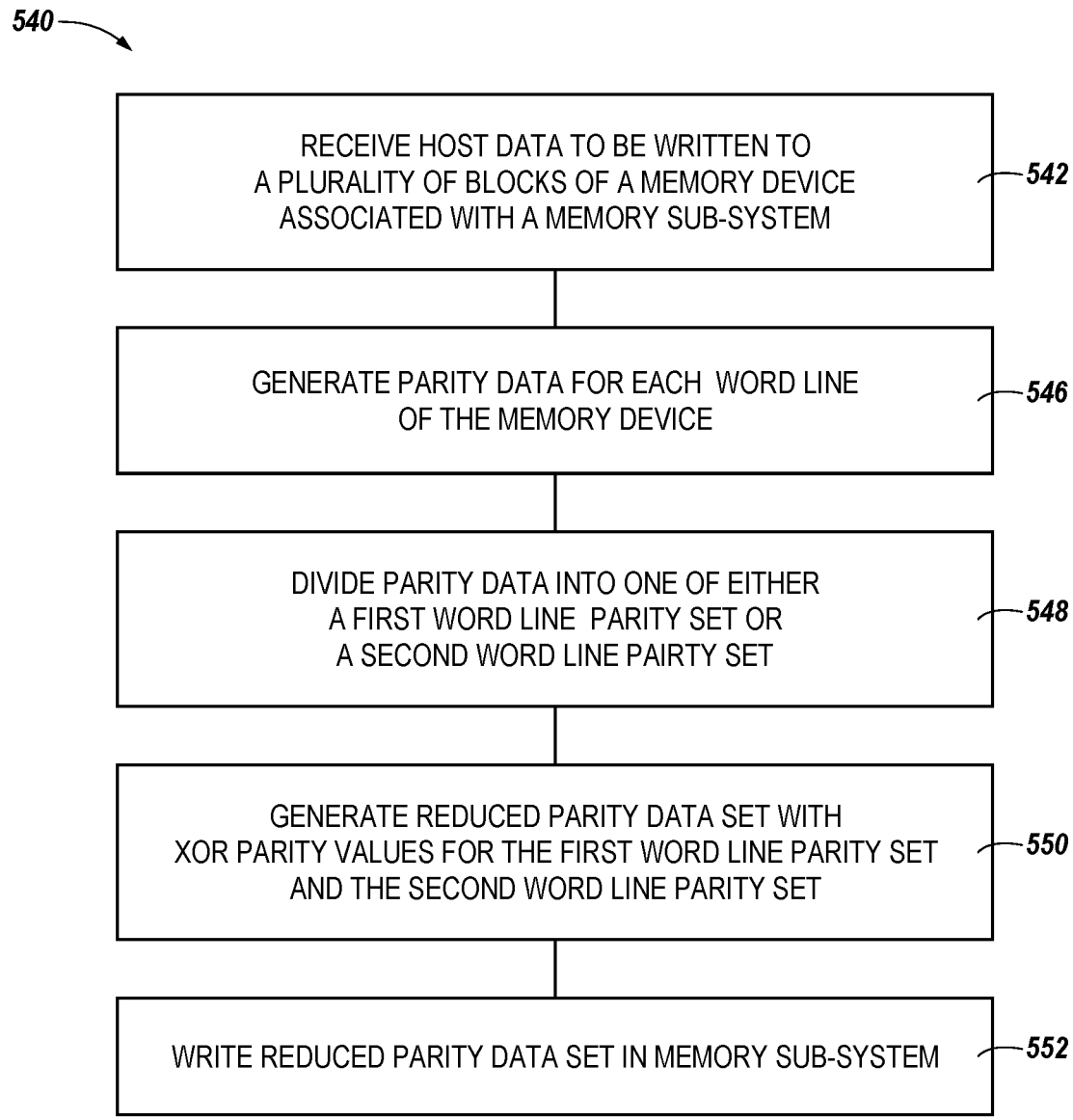
FIG. 5 is a flow diagram corresponding to a method for reduced parity data management in accordance with some embodiments of the present disclosure.

FIG. 5 is a flow diagram corresponding to a method for reduced parity data management in accordance with some embodiments of the present disclosure. The method 540 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 540 is performed by the reduced parity data management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 542, host data to be written to one or more blocks (e.g., the block 238-1 to 238-M illustrated in FIG. 2, herein) of the memory device (e.g., the memory device 330 illustrated in FIG. 3, herein) associated with a memory sub-system is received. In some embodiments, each block of the memory device is coupled to one of a number of word lines (e.g., the word lines 336-1 to 336-R illustrated in FIG. 3, herein) of the memory device.

At operation 546, parity data corresponding to recovery of the uncorrectable error for each word line of the memory device is generated. As discussed herein, the reduced parity data management component 113 generates parity data (e.g., the data 338-1 to 338-7 described in connection with FIG. 3, herein) for each word line of a block of the memory device 130, 140.

At operation 448 the parity data is divided into one of either a first word line parity set or a second word line parity set, as discussed herein. The first word line parity set can be analogous to the word line parity set 435-1 illustrated in FIG. 4B and the second word line parity set can be analogous to the word line parity set 435-2 illustrated in FIG. 4B, herein. As discussed herein, the reduced parity data management component 113 divides the parity data into one of either a first word line parity set or a second word line parity set.

At operation 550 a reduced parity data set (e.g., the reduced parity data set 437 illustrated in FIG. 4C, herein) with XOR parity values generated for the first word line parity set and for the second word line parity set. Again, the reduced parity data management component 113 generates the reduced parity data set with XOR parity values for the first word line parity set and for the second word line parity set and writes the reduced parity data set in the memory sub-system (e.g., in the local memory 119) at operation 552. For example, the reduced parity data set can be written as redundant array of independent NAND (RAIN) data as part of writing the data corresponding to recovery of the uncorrectable error. As described above, a further operation to perform a data recovery operation using the reduced parity data set can be performed by, for example, a processing device, such as the reduced parity data management component 113 illustrated in FIG. 1, herein. In some embodiments, the data recovery operation can be performed in response to a determination that a failure involving host data written to the memory device has occurred.

Figure 6:
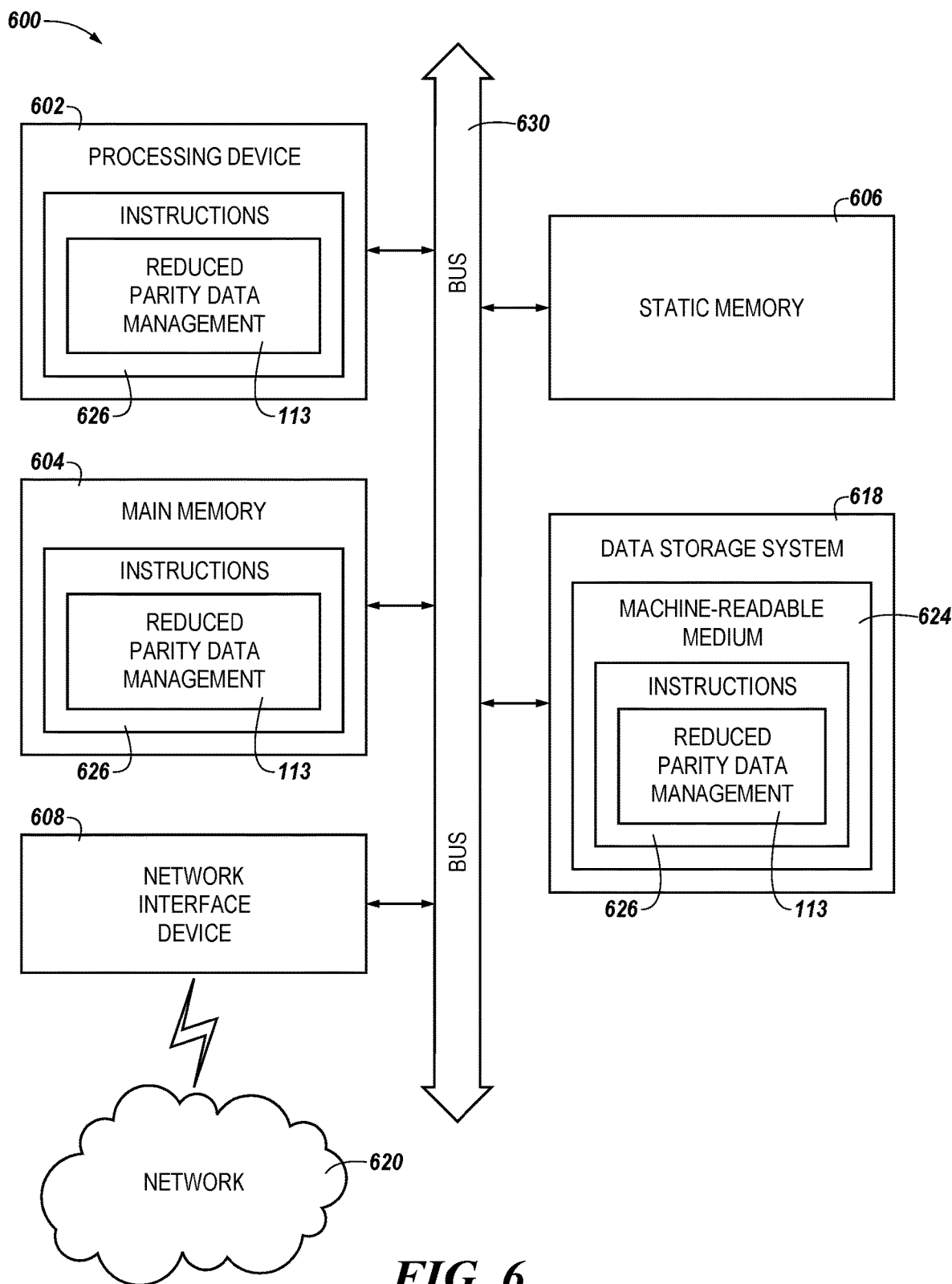
FIG. 6 is a block diagram of an example computer system in which embodiments of the present disclosure may operate.

FIG. 6 is a block diagram of an example computer system 600 in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the reduced parity data management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a reduced parity data management component (e.g., the reduced parity data management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium"

shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   generating parity data corresponding to a plurality of word lines coupled to respective blocks of a memory device;
   dividing the parity data into one of either a first word line parity set or a second word line parity set by separating the parity data from even numbered word lines into the first word line parity set and separating the parity data from odd numbered word lines into the second word line parity set; and
   generating a reduced parity data set for the first word line parity set and for the second word line parity set such that the reduced parity data set is stored within a quantity of word lines that is less than a total quantity of word lines among the plurality of word lines coupled to the respective blocks of the memory device.

2. The method of claim 1, further comprising performing a data recovery operation based on the reduced parity data set during idle time of the memory device.

3. The method of claim 1, wherein generating the parity data for one or more of the plurality of word line further comprises performing an exclusive or (XOR) operation using data written within the word lines of at least one block among the plurality of blocks.

4. The method of claim 1, further comprising writing the reduced parity data set to a cache memory of a controller coupled to the memory device.

5. The method of claim 1, further comprising recovering at least one uncorrectable error associated with a program status fail using the reduced parity data set.

6. The method of claim 1, wherein generating the reduced parity data set occurs in response to a successful program operation invoking a past page associated with the memory device.

7. An apparatus, comprising:
   a processing device configured to:
   generate parity data for each word line of a plurality of blocks of a memory device, wherein each block is coupled to one of a plurality of word lines;
   divide the parity data into one of either a first word line parity set or a second word line parity set based on a predetermined indexing protocol by causing parity values from odd numbered word lines to be grouped into the first word line parity set and parity values from even numbered word lines to be grouped into the second word line parity set; and
   generate a reduced parity data set for the first word line parity set and for the second word line parity set such that the reduced parity data set is stored by a quantity of word lines among the plurality of word lines that is less than a total quantity of word lines among the plurality of word lines.

8. The apparatus of claim 7, wherein the reduced parity data set is written to the memory device.

9. The apparatus of claim 7, wherein the reduced parity data set contains data corresponding to a parity portion of a redundant array of independent NAND (RAIN) recovery data written to the memory device.

10. The apparatus of claim 7, wherein the processing device is further configured to initiate a data recovery operation based on the reduced parity data set responsive to detection of a program status failure.

11. The apparatus of claim 10, wherein the processing device is further configured to:
monitor an operational state of the memory device, the operational state of the memory device including an active state corresponding to performing operations initiated from a host and an idle state corresponding to an absence of operations initiated from a host; and
initiate the data recovery operation based on the reduced parity data set in response to the operational state of the memory array entering the idle state.

12. A system, comprising:
a plurality of blocks each coupled to one of a plurality of word lines; and
a processing device coupled to the plurality of blocks, wherein the processing device is configured to:
detect parity data for each word line;
divide the parity data into one of either a first word line parity set or a second word line parity set by separating the parity data from even numbered word lines into the first word line parity set and separating the parity data from odd numbered word lines into the second word line parity set;
generate a reduced parity data set with exclusive or (XOR) parity values for the first word line parity set and for the second word line parity set, wherein a size of the reduced parity data set is reduced such that the reduced parity data set is stored by a quantity of word lines among the plurality of word lines that is less than a total quantity of word lines among the plurality of word lines associated with each block of the memory device.

13. The system of claim 12, wherein the processing device is configured to generate the reduced parity data set in response to a successful program operation on past page.

14. The system of claim 12, wherein the processing device is configured to write the reduced parity data set to the memory sub-system.

15. The system of claim 12, wherein the processing device is configured to write the reduced parity data set in a cache memory of a controller of the memory sub-system.

16. The system of claim 12, wherein the processing device is configured to recover at least one uncorrectable error associated with a program status fail using the reduced parity data set.

17. The system of claim 12, wherein the processing device is to perform operations comprising performing a data recovery operation based on the reduced parity data set during idle time of the memory device.

* * * * *